United States Patent [19]
Abe et al.

[11] Patent Number: 5,411,916
[45] Date of Patent: May 2, 1995

[54] METHOD FOR PATTERNING WIRINGS OF SEMICONDUCTOR INTEGRATED CIRCUIT DEVICE

[75] Inventors: Masahiro Abe, Yokohama; Yasukazu Mase, Fujisawa; Tomie Yamamoto, Yokohama, all of Japan

[73] Assignee: Kabushiki Kaisha Toshiba, Kawasaki, Japan

[21] Appl. No.: 77,946

[22] Filed: Mar. 18, 1993

Related U.S. Application Data

[60] Continuation of Ser. No. 808,744, Dec. 17, 1991, abandoned, which is a division of Ser. No. 609,601, Nov. 6, 1990, Pat. No. 5,126,819.

[30] Foreign Application Priority Data

Nov. 10, 1989 [JP] Japan ................. 1-293490

[51] Int. Cl.$^6$ ............................................ H01L 21/60
[52] U.S. Cl. ..................... 437/189; 437/195; 437/203; 437/228
[58] Field of Search ................ 437/195, 189, 228, 203

[56] References Cited

U.S. PATENT DOCUMENTS

| | | | |
|---|---|---|---|
| 4,196,443 | 4/1980 | Dingwall | 437/186 |
| 4,381,215 | 4/1983 | Reynolds et al. | 156/643 |
| 4,812,419 | 3/1989 | Lee et al. | 437/194 |

FOREIGN PATENT DOCUMENTS

| | | |
|---|---|---|
| 0166344 | 1/1986 | European Pat. Off. |
| 60-208845 | 10/1985 | Japan |
| 63-078554 | 4/1988 | Japan |
| 2029097 | 3/1980 | United Kingdom |

OTHER PUBLICATIONS

R. E. Oakley et al., "Pillars–The Way to Two Micron Pitch Multilevel Metallisation," IEEE VLSE Multilevel Interconnection Conference Proceedings, Jun. 21–22, 1984, pp. 23–29.

*Primary Examiner*—T. N. Quach
*Attorney, Agent, or Firm*—Finnegan, Henderson, Farabow, Garrett & Dunner

[57] ABSTRACT

As shown in FIG. 4, a wiring pattern of a semiconductor integrated circuit device of the present invention comprises a wiring portion extending from a connection hole and a connection portion located on the connection hole and having a matching allowance with respect to said connection hole on said wiring portion side being formed wider than a predetermined matching allowance by a predetermined width with which a required yield of successful matching can be assured.

20 Claims, 5 Drawing Sheets

METHOD FOR PATTERNING WIRINGS OF SEMICONDUCTOR INTEGRATED CIRCUIT DEVICE

This application is a continuation of application Ser. No. 07/808,744, filed Dec. 17, 1991, now abandoned, which was a division of application Ser. No. 07/609,601, filed Nov. 6, 1990, issued as U.S. Pat. No. 5,126,819 on Jun. 30, 1992.

BACKGROUND OF THE INVENTION

1. Field of the Invention

The present invention relates to the wiring pattern of a semiconductor integrated circuit device, and more particularly to the technique of matching the allowance between a connection hole such as a contact hole or through hole, and a wiring.

2. Description of the Related Art

Figure 1A:
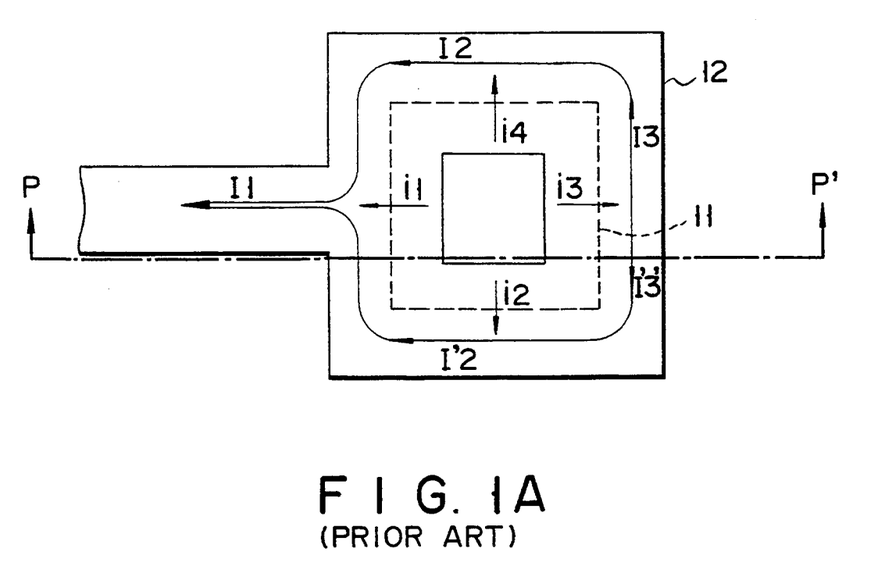
FIG. 1A is a plane view of the wiring pattern of a conventional semiconductor integrated circuit device.
Figure 1B:
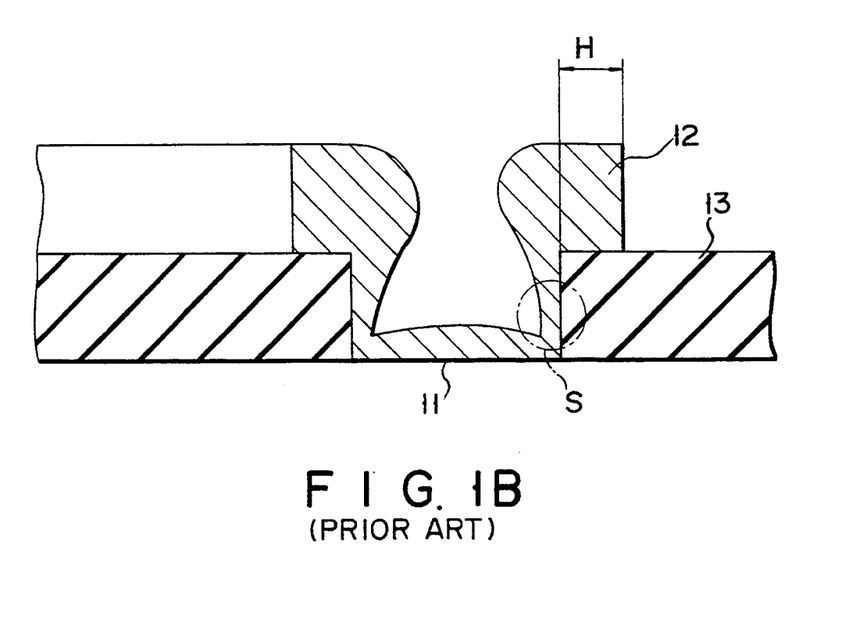
FIG. 1B is a cross-sectional view of FIG. 1A along the line P—P'.

Conventionally, the matching allowance between a connecting hole (e.g., a contact hole or a through hole) and a wiring is set equally around the connecting holes, in order to compensate for the deviation which occurs in the step of lithography, randomly in every direction. When the deviation is zero, the width of the wiring around the connection hole, the around width H, at the periphery of the connecting hole is formed as shown in FIGS. 1A and 1B. FIGS. 1A and 1B illustrate a connecting hole 11, wiring layer 12, and an inter-layer insulation layer 13.

Figure 2:
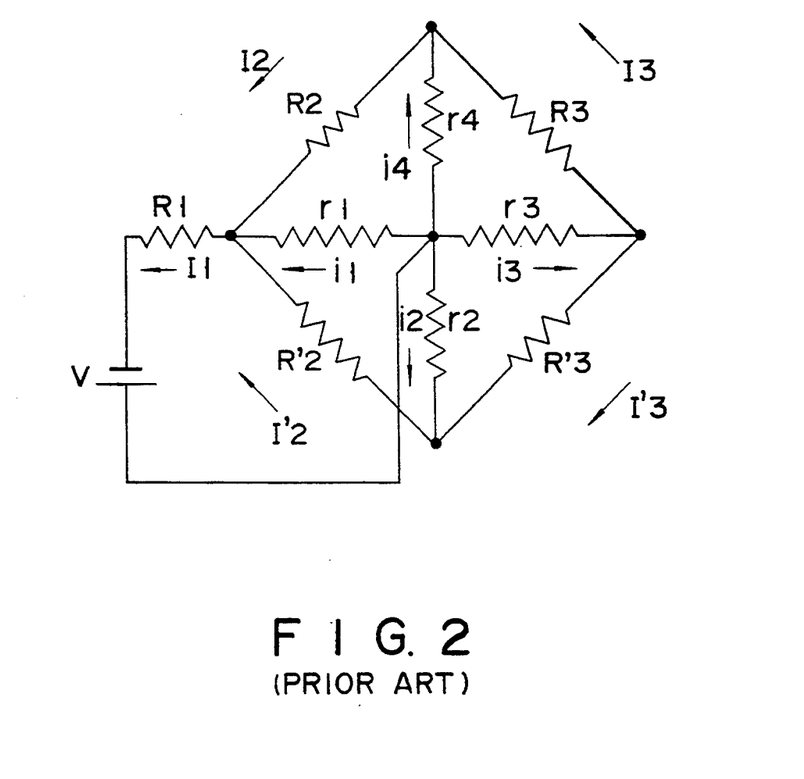
FIG. 2 is a conventional equivalent circuit of the wiring resistance of a wiring near a connection hole, such as a contact hole or hole through hole.

As is shown in FIG. 1B, a notch S is formed in the wiring layer in the connection hole 11. When electric current flows through the connection hole 11, resistance against the current increases at the section where the notch S is located. The wiring resistance around connection hole 11 (to be called "connection hole resistance" hereinafter) can be substituted with an equivalent circuit shown in FIG. 2, which is designed so that when a deviation between the connection hole 11 and the pattern of the wiring 12 is zero, current paths $I_2$ and $I_2'$ on the wiring extension side become wide.

In reality, however, due to a matching error a in the step of pattern matching, a variety of deviations may occur between the connection hole 11 and the wiring layer 12.

Figure 3A:
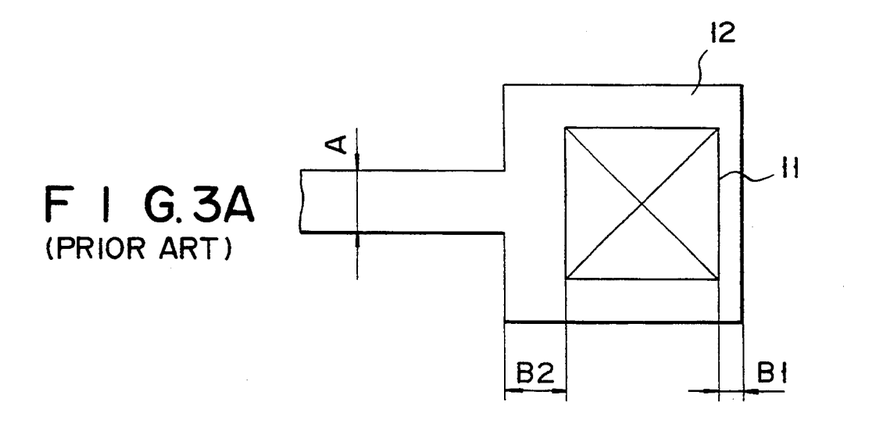
FIGS. 3A–3C are cross-sectional views of examples of conventionally matching deviation between the connection hole and the wiring.
Figure 3B:
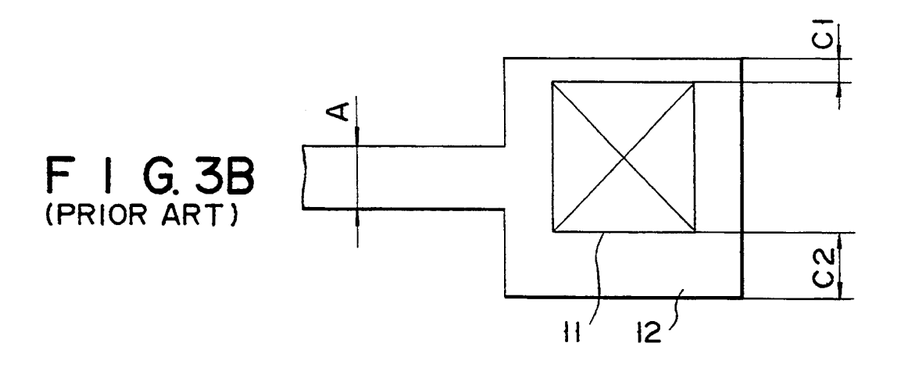
Figure 3C:
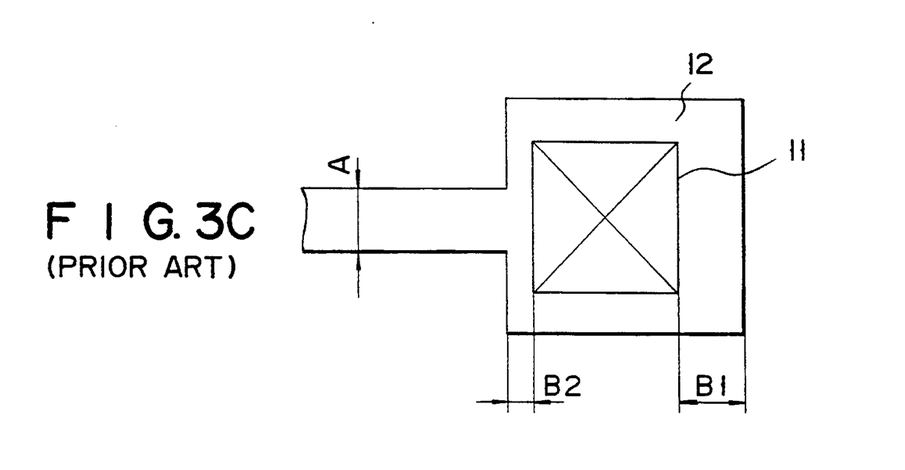

FIGS. 3A to 3C illustrate several examples of matching deviation between the connection hole 11 and the wiring layer 12.

FIG. 3A shows a case where the connection hole 11 deviates in the direction opposite to the wiring extension side. In this case, as the around width $B_1$ narrows, resistances $R_3$ and $R_3'$ inevitably increase. However, electrical current $i_3$, which is affected by the resistances, comprises a very small portion of the total current. Further, as the around width $B_2$ widens, resistances $R_2$ and $R_2'$ decrease. Therefore there is little change in connection hole resistance as a whole.

FIG. 3B shows a case where the connection hole 11 deviates in the vertical direction toward the wiring extension side. In this case, around width $C_1$ narrows and around width $C_2$ widens. Therefore resistances $(R_2+R_3)$ and $(R_2'+R_3')$ respectively increase and decrease thereby canceling each other, so that the connection hole resistance is only slightly affected, as a whole.

FIG. 3C shows a case where the connection hole 11 deviates towards the wiring extension side. In this case, around width $B_2$ narrows, and the effective current paths $I_2$ and $I_2'$ narrow, whereby the connection hole resistance inevitably increases. More specifically, current flows through all of resistances $r_1$, $R_2$ and $R_3$. As around width $B_2$ narrows, currents $I_2$ and $I_2'$ flowing through resistances $R_2$ and $R_2'$ decrease, and current $i_1$ flowing through resistance $r_1$, which becomes high due to device structure, increases. Therefore, the matching deviation directly affects the connection hole resistance, and disconnection of the wiring due to heat-emission or electromigration may occur at the notch S.

SUMMARY OF THE INVENTION

The object of the present invention is to provide a wiring pattern of a semiconductor integrated circuit device in which the connection hole resistance does not increase even if matching deviation between a connection hole such, as a contact hole or through hole, and a wiring layer occurs.

To achieve the above-mentioned object, the wiring pattern of the semiconductor integrated circuit device according to the present invention comprises a wiring portion extending from the connection hole and a connection portion located above the connection hole and connected to the wiring portion so that it makes an obtuse angle, in which a matching allowance for the connection hole on the wiring portion side is formed wider than the regular matching allowance by a predetermined width with which a required yield of successful matching can be assured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A wiring pattern of a semiconductor integrated circuit device according to an embodiment of the present invention will be described with reference to the accompanying drawings wherein like reference numerals designate like items and explanations thereof are omitted.

Figure 4:
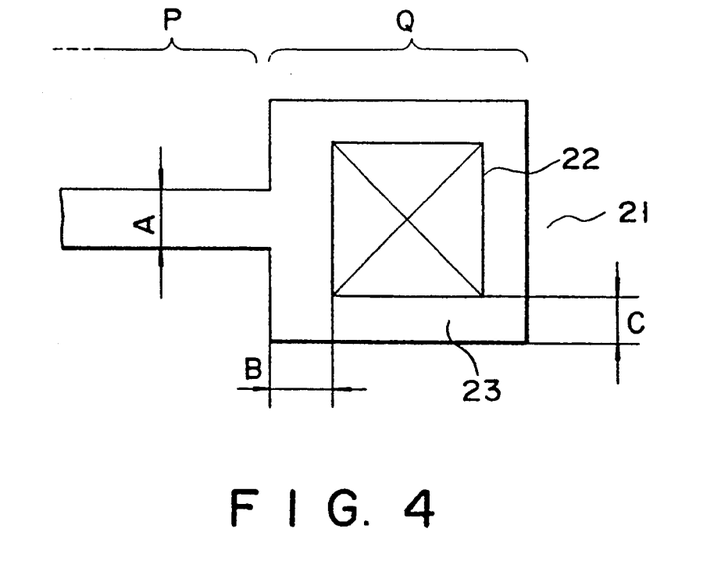
FIG. 4 is a plane view of a wiring pattern of a semiconductor integrated circuit device according to an embodiment of the present invention.

FIG. 4 shows a wiring pattern of a semiconductor integral circuit according to a first embodiment of the present invention, including a semiconductor substrate 21, a connection hole 22, a wiring layer 23, a wiring width A, matching allowances between the connection hole and the wiring layer B and C, a wiring portion P, and a connection portion Q.

The connection hole 22 such as a contact hole or a through hole, is formed in the semiconductor substrate 21, and the wiring layer 23 is formed around the connection hole 22. The wiring layer 23 consists of the wiring portion P, which is a wiring portion extending in one direction from a side of the square-shaped connection hole 22, and connection portion Q, which is a wiring portion located adjacent to the connection hole 22. The matching allowance B on the wiring portion P side of the connection portion Q is formed so that it has a predetermined width, in other words, a width with which a sufficient current path can be obtained when the matching deviation of the wiring layer 23 is set to zero. The matching allowance B on the wiring portion P side is set so that it is a predetermined width wider than the regular matching allowance to cover the necessary matching efficiency. The matching allowance C at the sides other than the wiring portion P side is set to an appropriate width so that the pattern of the wiring layer 23 does not become too large.

For example, suppose that the minimum around width of the wiring portion P side for obtaining a sufficient electric current path is about 1.0 $\mu$m. When the required yield of the successful allowance is $3\sigma$ ($\sigma$ is a value for dispersion in the normal distribution), and the predetermined width with which $3\sigma$ can be assured is about 0.5 $\mu$m, the allowance B on the wiring portion P side should be set to about 1.5 $\mu$m to obtain a sufficient current path. When the matching deviation of the wiring is zero, the around width is about 1.5 $\mu$m as originally designed for the width of the matching allowance B. Even if the matching deviation of the wiring is as much as 0.5 $\mu$m in the direction opposite to the wiring portion P, the around width of about 1.0 $\mu$m can be assured.

The matching allowances C for the sides other than the wiring portion P side are set to about 0.7 $\mu$m to obtain an around width of, for example, about 0.2 $\mu$m at a minimum. This is because, if the width of the matching allowances C is set to the same as that of the matching allowance B, the size of the wiring pattern of the wiring layer 23 around the connection hole 22 becomes very large, thereby lowering the degree of integration. The matching allowances other than that of the wiring portion P side should only be set to a minimally necessary width so that the wiring pattern does not become too large. In this embodiment, the wiring width A is set to about 2 $\mu$m, and the size of the connection hole is set to about 3.0$\times$3.0 $\mu$m.

According to such a structure, the matching allowance B of the wiring portion P side is set a predetermined width wider than the predetermined allowance so as to cover the matching deviation even in the case where the wiring layer width deviates in the direction opposite to the wiring portion P side. Specifically, even if the wiring layer 23 deviates in the direction opposite to the wiring portion P side, a sufficient around width can be obtained within the range of the successful yield of matching allowance, so that the contact hole resistance is not increased.

Figure 5:
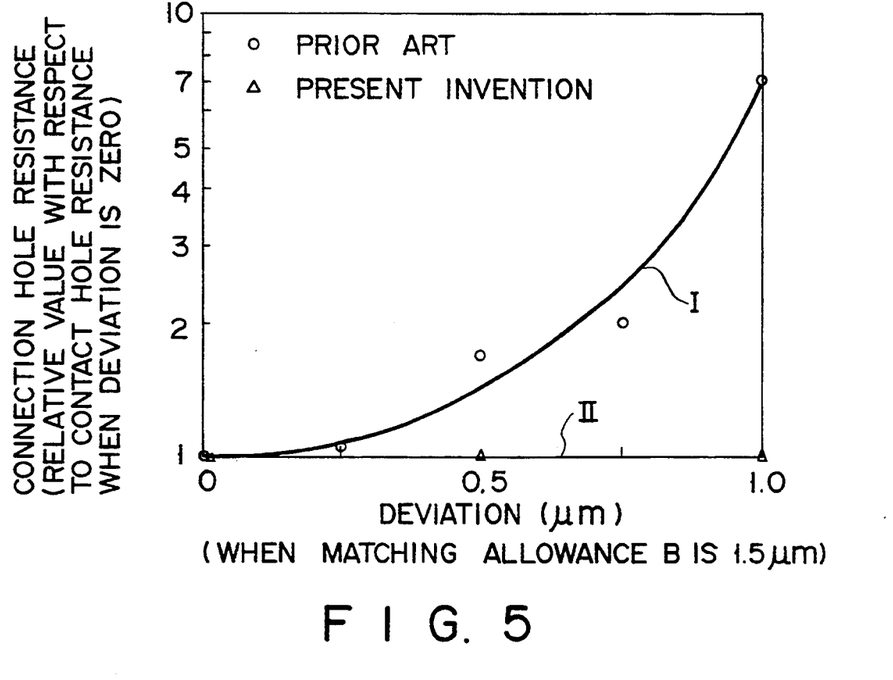
FIG. 5 shows a relationship between the matching deviation amount and the connection hole resistance comparing a conventional semiconductor device with the present invention.

In the meantime, the connection hole resistance where the wiring layer 23 includes the matching allowance B of about 1.5 $\mu$m and the matching allowance C of about 0.7 $\mu$m was measured and the result is shown in FIG. 5 as represented by straight line II. As represented by the line II, when the amount of deviation in the direction opposite to the wiring portion P side is within 1.0 $\mu$m, in other words, the around width is in the range of 0.5–1.5 $\mu$m in the wiring layer 23, no increment in the connection hole resistance was detected. Further, the connection hole resistance in the case where the matching allowances for all sides of the connection hole 22 are equally set to about 1.0 $\mu$m was measured and the result is also shown in this figure as represented by curve I.

The present invention was applied to a bipolar LSI (A/D converter) having 4,500 elements, and no decrement in the degree of integration was detected.

Figure 6:
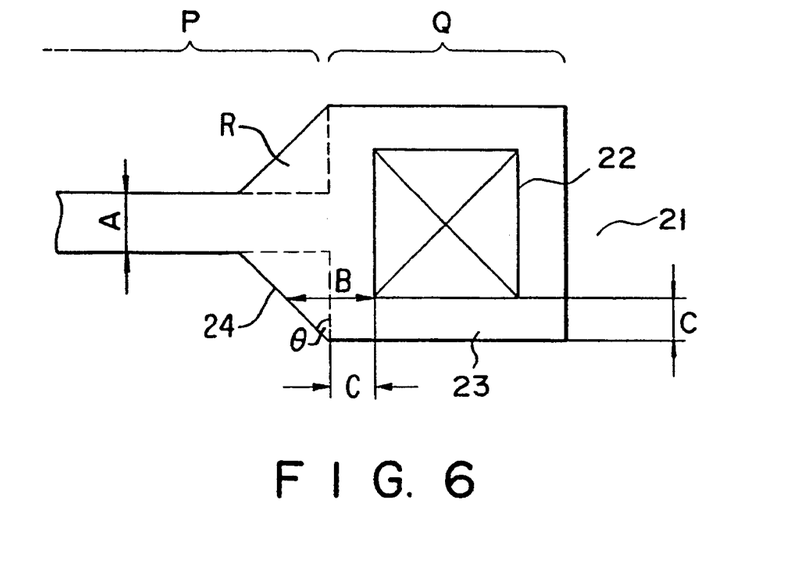
FIG. 6 is a plane view showing a wiring pattern of a semiconductor integrated circuit according to a second embodiment of the present invention.

FIG. 6 shows a wiring pattern of a semiconductor integrated circuit device according to a second embodiment of the present invention.

As shown in FIG. 6, the connection hole 22, such as a contact hole, or through hole is formed on the semiconductor substrate 21, and the wiring layer 23 is formed on the connection hole 22. In the wiring layer 23, the wiring portion P and the contact portion Q are connected by a portion R of portion P so that an oblique external edge of portion R makes obtuse angles (greater than 90° and less than 180°) with the adjoining horizontal external edges of portions P and Q. The first embodiment mentioned above is a case where the wiring portion P and the contact portion Q are connected at a right angle, so that the matching allowance B will always be no more than the dimension C. In FIG. 6, the matching allowance B of the wiring portion P side is formed wider than a predetermined width to assure a sufficient current path when the matching deviation of matching pattern is set to zero. In detail, the matching allowance B is formed wider than the predetermined matching allowance C by a predetermined width which assures the required yield of successful allowance.

For example, suppose that the minimum around width of the wiring portion P side for obtaining a sufficient electric current path is about 1.0 $\mu$m. When the required yield of the successful allowance is $3\sigma$ ($\sigma$ is a value for dispersion in the normal distribution), and the predetermined width with which $3\sigma$ can be assured is about 0.5 $\mu$m, the allowance B on the wiring portion P side should be set to about 1.5 $\mu$m to obtain a sufficient current path. Further, the matching allowances other than the wiring portion P side are designed to be about 0.7 $\mu$m so as to obtain an around width of, for example, about 0.2 $\mu$m at a minimum. With such a structure, when the wiring layer 23 deviates in the direction opposite to wiring portion P, the around width of the wiring portion P side of contact portion Q may decrease, considering the actual matching deviation and the relevant angle. However, the matching allowance B is, in advance, formed wider than the predetermined matching allowance C by a predetermined width with which the actual matching deviation can be covered. Therefore, even if the wiring layer 23 deviates in the direction opposite to the wiring portion P side, the necessary around width can be obtained, and therefore the connection hole resistance does not increase.

Figure 7:
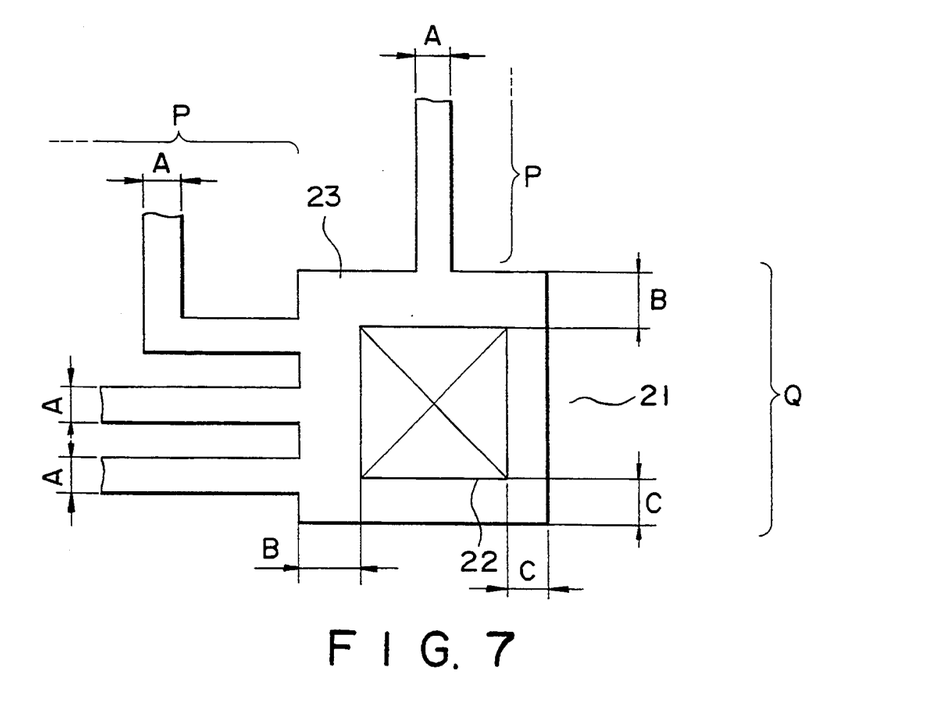
FIG. 7 is a plane view showing a wiring pattern of a semiconductor integrated circuit according to a third embodiment of the present invention.

Lastly, the above-described embodiments include the cases where there is only one wiring portion P. However, the present invention, of course, can be applied in the case where there is more than one wiring portion P, for example, as shown in FIG. 7. In this case also, there will not be any problem if the matching allowances B of each of the wiring portions P is formed wider than a predetermined matching allowance by a width with which a required yield can be assured.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A method for patterning wirings, the method comprising the steps of:
    forming a connection hole in a semiconductor substrate so as to be rectangular in shape when viewed from above the semiconductor substrate and to have a plurality of sides;
    forming on a surface of the semiconductor substrate a conductive layer thinner in a first portion along the sidewalls of said connection hole than in a second portion alongside said connection hole; and
    patterning the conductive layer to form first and second wiring sections, such that:
    (a) the first wiring section is rectangular in shape when viewed from above the semiconductor substrate and has first to fourth sides, each of which is parallel to one of the plurality of sides of the connection hole,
    (b) a first distance, between the first side of the first wiring section and one of the plurality of sides of the connection hole which is closest to the first side is greater than a second distance, between one of the second to fourth sides of the first wiring section and one of the plurality of sides of the connection hole which is closest to the respective one of the second to fourth sides, and
    (c) the second wiring section has an end portion connected to the first side of the first wiring section and has a width narrower than a length of the first side of the first wiring section,
the patterning providing that the first distance is greater than a minimum width by an amount assuring a desired yield in the presence of the expected distribution of patterning errors.

2. A method for patterning wirings according to claim 1, wherein said connection hole is approximately 3.0 $\mu$m $\times$ 3.0 $\mu$m square.

3. A method for patterning wirings according to claim 1, wherein the first distance is approximately 1.5 $\mu$m, the second distance is approximately 0.7 $\mu$m.

4. A method for patterning wirings according to claim 1, wherein the wiring width of said second wiring section is approximately 2.0 $\mu$m.

5. A method for patterning wirings according to claim 1, wherein said connection hole is one of a contact hole and a through hole.

6. A method for patterning wirings according to claim 1, wherein the relationships a$<$c$<$b are satisfied, where a indicates the thickness of said first portion provided along the sidewalls of said connection hole, b indicates the first distance, and c indicates the second distance.

7. A method for patterning wirings, the method comprising the steps of:
    forming a connection hole in a semiconductor substrate so as to be rectangular in shape when viewed from above the substrate and to have a plurality of sides;
    forming on a surface of the semiconductor substrate a conductive layer thinner in a first portion along the sidewalls of said connection hole than in a second portion alongside said connection hole; and
    patterning the conductive layer to form first, second and third wiring sections, such that:
    (a) the first wiring section is rectangular in shape when viewed from above the semiconductor substrate and has first to fourth sides, each of which is parallel to one of the plurality of sides of the connection hole,
    (b) a first distance, between the first side of the first wiring section and one of the plurality of sides of the connection hole which is closest to the first side is greater than a second distance, between one of the second to fourth sides of the first wiring section and one of the plurality of sides of the connection hole which is closest to the respective one of the second to fourth sides,
    (c) the second wiring section has an end portion connected to the first side of the first wiring section and has a width narrower than a length of the first side of the first wiring section, and
    (d) the third wiring section is defined by the first wiring section, the second wiring section, and a straight line which extends through one end of each of the others of the respective second to fourth sides of the first wiring section and forms an angle of $\theta$ where $(0 < |\theta| < \pi/2)$, with reference to the first side of the first wiring section.

8. A method for patterning wirings according to claim 7, wherein said connection hole is approximately 3.0 $\mu$m $\times$ 3.0 m square.

9. A method for patterning wirings according to claim 7, wherein the first distance is approximately 1.5 $\mu$m, and the second distance is approximately 0.7 $\mu$m.

10. A method for patterning wirings according to claim 7, wherein the wiring width of said second wiring section is approximately 2.0 $\mu$m.

11. A method for patterning wirings according to claim 7, wherein said connection hole is one of a contact hole and a through hole.

12. A method for patterning wirings according to claim 7, wherein the relationships a$<$c$<$b are satisfied, where a indicates the thickness of the first portion of the conductive layer along the sidewalls, b indicates the first distance, and c indicates the second distance.

13. A method for patterning wirings, the method comprising the steps of:
    forming a connection hole in a semiconductor substrate so as to be rectangular in shape when viewed from above the semiconductor substrate and to have a plurality of sides;
    forming on a surface of the semiconductor substrate a conductive layer thinner in a first portion along the sidewalls of said connection hole than in a second portion away from said first portion; and patterning the conductive layer to form first and second wiring sections, such that:

(a) the first wiring section is rectangular in shape when viewed from above the semiconductor substrate and has first to fourth sides, each of which is parallel to one of the plurality of sides of the connection hole, (b) a first distance, between the first side of the first wiring section and one of the plurality of sides of the connection hole which is closest to the first side is greater than a second distance, between one of the second to fourth sides of the first wiring section and one of the plurality of sides of the connection hole which is closest to the respective one of the second to fourth sides, and (c) the second wiring section has an end portion connected to the first side of the first wiring section and has a width narrower than a length of the first side of the first wiring section, the patterning providing that the first distance is greater than a minimum width by an amount assuring a desired yield in the presence of the expected distribution of patterning errors.

14. A method for patterning wirings according to claim 13, wherein said connection hole is one of a contact hole and a through hole.

15. A method for patterning wirings according to claim 13, wherein the relationships $a<c<b$ are satisfied, where a indicates the thickness of said first portion provided along the sidewalls of said contact hole, b indicates the first distance, and c indicates the second distance.

16. A method for patterning wirings according to claim 13, further comprising:

a third wiring section defined by the first wiring section, the second wiring section, and a straight line which extends through one end of each of the others of the respective second to fourth sides of the first wiring section and forms an angle of $\theta$ where $(0<|\theta|<\pi/2)$, with reference to the first side of the first wiring section.

17. A method for patterning wirings according to claim 16, wherein said connection hole is approximately 3.0 $\mu$m $\times$ 3.0 $\mu$m square.

18. A method for patterning wirings according to claim 16, wherein the first distance is approximately 1.5 $\mu$m, and the second distance is approximately 0.7 $\mu$m.

19. A method for patterning wirings according to claim 16, wherein said connection hole is one of a contact hole and a through hole.

20. A method for patterning wirings according to claim 16, wherein the relationships $a<c<b$ are satisfied, where a indicates the thickness of the first portion of the conductive layer along the sidewalls, b indicates the first distance, and c indicates the second distance.

* * * * *

UNITED STATES PATENT AND TRADEMARK OFFICE
CERTIFICATE OF CORRECTION

PATENT NO. : 5,411,916
DATED : May 02, 1995
INVENTOR(S) : Masahiro ABE et al

It is certified that error appears in the above-indentified patent and that said Letters Patent is hereby corrected as shown below:

On title page, item [22], change "Filed: March 18, 1993" to -- Filed: June 18, 1993 --.

Signed and Sealed this

Eighth Day of August, 1995

Attest:

BRUCE LEHMAN

*Attesting Officer*  *Commissioner of Patents and Trademarks*